(12) United States Patent
Jibry

(10) Patent No.: US 7,720,139 B2
(45) Date of Patent: May 18, 2010

(54) EQUALISER CIRCUIT

(75) Inventor: Rafel Jibry, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 1286 days.

(21) Appl. No.: 11/191,730

(22) Filed: Jul. 28, 2005

(65) Prior Publication Data

US 2006/0023780 A1 Feb. 2, 2006

(30) Foreign Application Priority Data

Jul. 29, 2004 (GB) ................... 0416913.2

(51) Int. Cl.
    *H03H 7/30* (2006.01)
(52) U.S. Cl. .............. 375/232; 375/233; 375/231; 375/355; 375/362; 375/346; 369/47.28; 360/51; 360/46; 360/65; 708/322
(58) Field of Classification Search ............... 375/350, 375/231, 232; 369/47.28; 360/51, 46, 65; 708/322
    See application file for complete search history.

(56) References Cited

U.S. PATENT DOCUMENTS

| 5,555,200 | A | | 9/1996 | Chiang | |
|---|---|---|---|---|---|
| 5,754,352 | A | * | 5/1998 | Behrens et al. | 360/51 |
| 6,202,075 | B1 | | 3/2001 | Azadet | |
| 6,906,654 | B2 | * | 6/2005 | Walsh et al. | 341/155 |
| 7,126,771 | B2 | * | 10/2006 | Jibry | 360/46 |
| 7,233,616 | B1 | * | 6/2007 | Nayler | 375/231 |
| 2003/0037084 | A1 | * | 2/2003 | Walsh et al. | 708/322 |
| 2003/0095592 | A1 | * | 5/2003 | Bergmans et al. | 375/232 |
| 2003/0198165 | A1 | | 10/2003 | Mouri et al. | |
| 2003/0206604 | A1 | * | 11/2003 | Lai | 375/350 |
| 2004/0071206 | A1 | * | 4/2004 | Takatsu | 375/232 |
| 2005/0249275 | A1 | * | 11/2005 | Yen et al. | 375/232 |
| 2007/0047127 | A1 | * | 3/2007 | Hutchins et al. | 360/65 |
| 2007/0053261 | A1 | * | 3/2007 | Frisson et al. | 369/47.28 |

FOREIGN PATENT DOCUMENTS

EP 1320097 6/2003

* cited by examiner

*Primary Examiner*—Sudhanshu C Pathak

(57) ABSTRACT

One embodiment of an equalizer circuit has an FIR filter 116 in the asynchronously oversampled domain with a filter coefficient adaptation module that adapts the filter coefficients to the transfer function of a data read channel. Applications include tape drives, drives for optical and magnetic discs as well as receivers. The filter adaptation is performed on the basis of an error signal delivered by a slicer 128 which operates on synchronous samples after timing recovery and sample reconstruction.

23 Claims, 7 Drawing Sheets

EQUALISER CIRCUIT

CLAIM TO PRIORITY

This application claims priority to copending United Kingdom utility application entitled, "EQUALISER CIRCUIT," having serial no. GB 0416913.2, filed Jul. 29, 2004, which is entirely incorporated herein by reference.

TECHNICAL FIELD

The present disclosure relates to the field of digital signal processing, and more particularly without limitation, to signal equalisation.

BACKGROUND

The usage of digital signal processing techniques for recovery of digital information from an analogue recording or transmission signal is as such known from the prior art. For example, U.S. patent application 20020122478A1, which is incorporated herein in its entirety, shows a signal-processing circuit and a recording and playback apparatus employing the same. A two-stage equalisation is carried out by using first and second equalisation circuits provided on the upstream and downstream sides from a phase-locked loop circuit.

The first equalisation circuit on the upstream side from the phase-locked loop circuit is composed of a transversal filter, to minimise an equalisation error caused by the first equalisation circuit in order to stabilise the operation of the phase-locked loop circuit. Another signal-processing circuit including an analogue-to-digital converter and a digital phase-locked loop circuit for receiving the output from the analogue-to-digital converter and a recording and playback apparatus using the same are also disclosed, wherein the output from the analogue-to-digital converter is input as the digital signal in the digital phase-locked loop circuit in order to fetch a detection point voltage for stabilisation of the operation of the phase-locked loop circuit.

The digital FIR upstream of the timing recovery block can be adapted gradually and periodically in the over-sampled domain but not in real time. Usage of a synchronous adaptive FIR filter after the timing recovery block in order to adapt the synchronous errors, and then convolving the adapted FIR response with that of the FIR upstream of the timing recovery block to derive a new response for the FIR upstream of the timing recovery block is costly, as two FIR filters are required, and complicated as convolution algorithms are relatively expensive to be part of a feedback loop. Another substantial disadvantage is the required expense in terms of silicon space and the relatively high power consumption and power dissipation.

SUMMARY

In accordance with the present disclosure, there is provided an embodiment of an equaliser circuit for equalising first samples of an asynchronously over-sampled signal. The equaliser circuit has an input for inputting the first samples into an finite impulse response (FIR) filter. The FIR filter has a set of filter coefficients. As a result of the FIR filtering, the first samples are equalised. The equaliser circuit has a second input for inputting an error signal. The error signal is indicative of a deviation of a second sample of an equalised synchronous signal from one of a set of a predefined signal levels. The equalised synchronous signal is reconstructed from the equalised first samples. Further, the equaliser circuit has a circuit component for adaptation of the filter coefficients based on the error signal and a sequence of the first samples.

In accordance with a further embodiment of the present disclosure, the error signal has a delay with respect to a current first sample, and the sequence of the first samples used for the adaptation of the filter coefficients has substantially the same delay.

In accordance with a further embodiment of the present disclosure, the equaliser circuit has a memory for storing past first samples within a time window covering at least the delay.

In accordance with a further embodiment of the present disclosure, the error signal is multiplied by one of the first samples of the sequence and the corresponding filter coefficient is updated based on the result of the multiplication. In one embodiment, the result of the multiplication is multiplied by an adaptation gain factor.

In accordance with a further embodiment, only the sign of the first sample is used for the adaptation of the filter co-efficient. This has the advantage that a multiplier per filter coefficient can be avoided. This is advantageous both in terms of the required silicon space and power dissipation.

In accordance with a further embodiment, a barrel shifter is used for scaling the error signal. Again, this is advantageous in terms of the required silicon space and power dissipation.

In accordance with a further embodiment, the adaptation value for updating the filter coefficient is low pass filtered for reduction of adaptation noise. In one embodiment, this is accomplished using an accumulator that has a larger bit width than the corresponding multiplier and by using only the most significant bit positions of the accumulator as an input for the multiplier.

Embodiments of the present disclosure are particularly advantageous for applications where the channel transfer function upstream of the PLL is changing or variable. Embodiments of the present disclosure facilitate the derivation and use of a precise FIR impulse response to equalise an asynchronously over-sampled signal received over a given read channel.

Other systems, methods, features, and advantages of the present disclosure will be or become apparent to one with skill in the art upon examination of the following drawings and detailed description. It is intended that all such additional systems, methods, features, and advantages be included within this description and be within the scope of the present disclosure.

BRIEF DESCRIPTION OF THE DRAWINGS

In the following, embodiments of the present disclosure will be described by way of example only by making reference to the drawings in which.

DETAILED DESCRIPTION

Figure 1:
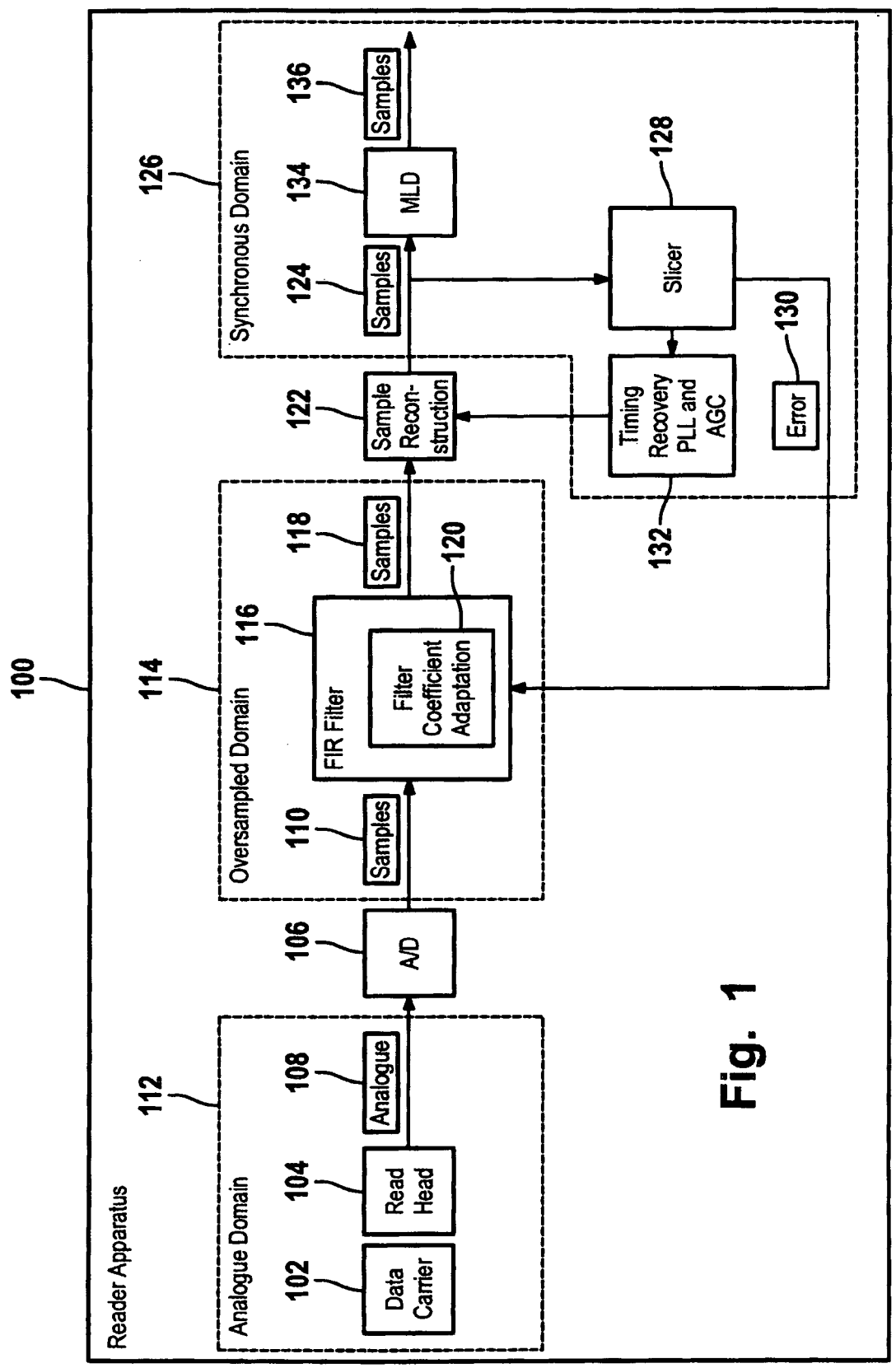
FIG. 1 is a block diagram of an embodiment of a reader apparatus for reading data from a data carrier.

FIG. 1 shows reader apparatus 100. For example, reader apparatus 100 is a tape drive or a disc drive for reading a magnetic or optical data carrier 102 by means of magnetic or optical read head 104. FIG. 1 shows data carrier 102 after it has been loaded into reader apparatus 100.

Read head 104 is coupled to analogue-to-digital converter 106. Converter 106 converts a signal 108, such as an analogue signal or data pattern, delivered by read head 104 into samples 110. Samples 110 represent an asynchronously over-sampled signal in over-sampled domain 114 as a result of the analogue-to-digital conversion from analogue domain 112.

Converter 106 is coupled to finite impulse response (FIR) filter 116. FIR filter 116 serves for equalising the samples 110 in order to provide equalised samples 118 at its output. FIR filter 116 has filter coefficient adaptation circuitry 120 in order to adapt the filter coefficients of the FIR filter 116 to the channel transfer function of the data read channel established between data carrier 102 and read head 104. The purpose of the adaptation circuitry 120 is to adapt to changes of the channel transfer function and compensate for them, such that the output of the FIR filter 116 remains at, or near, the ideal equalised target values.

FIR filter 116 is coupled to sample reconstruction module 122 that serves for construction of samples 124 of the equalised synchronous signal of synchronous domain 126. The output of sample reconstruction module 122 is coupled to slicer 128. In one embodiment considered here, slicer 128 is a three-level slicer having signal levels −64, 0 and +64 units corresponding to the expected target values of the samples 124. For example, the signal level is given in mV.

Slicer 128 generates error signal 130 for each sample 124. The error signal 130 indicates the deviation of the value of the current sample 124 from the closest of the predefined signal levels of slicer 128. For example, if the value of the current sample 124 is +66, the closest predefined level is +64 and hence the error signal 130 is +2. If the value of a current sample 124 is −2, the closest predefined signal level of slicer 128 is 0, and thus the error signal 130 is −2. Likewise, if the value of a current sample 124 is −58, the closest one of the predefined signal levels of slicer 128 is −64, and hence error signal 130 is +6.

Slicer 128 is coupled to timing recovery phase-locked loop (PLL) and automatic gain control (AGC) module 132 that has its output coupled to sample reconstruction module 122.

Sample reconstruction module 122 has its output coupled to maximum likelihood detector (MLD) 134 for conversion of samples 124 into data samples 136. In one embodiment, MLD detector 134 is implemented as a Viterbei decoder. Depending on the application, MLD detector 134 is coupled to a rendering application, processor, and/or a network.

In operation, data carrier 102 is loaded into reader apparatus 100. By means of read head 104, a read channel is established in order to produce analogue signal 108. Analogue signal 108 is asynchronously over-sampled and analogue-to-digital converted by converter 106, which provides samples 110 in the over-sampled domain 114. The samples 110 are equalised by means of FIR filter 116, which provides equalised samples 118.

The coefficients of the FIR filtering performed by FIR filter 116 are adapted to the transfer function of the established read channel by the adaptation circuitry 120. This adaptation can be performed during an adaptation phase, after which the filter coefficients are kept constant or permanently if the read channel keeps fluctuating.

The resultant equalised samples 118 are used by sample reconstruction module 122, in order to provide synchronous samples 124 in synchronous domain 126. Slicer 128 compares the values of equalised samples 124 to a given set of predefined target signal levels, in order to provide error signal 130 for each one of the samples 124. Sample reconstruction module 122 uses the outputs of timing recovery PLL and ACG module 132, in order to perform the sample reconstruction. By means of MLD detector 134, a maximum likelihood detection is performed on samples 124, in order to provide the data samples 136.

Figure 2:
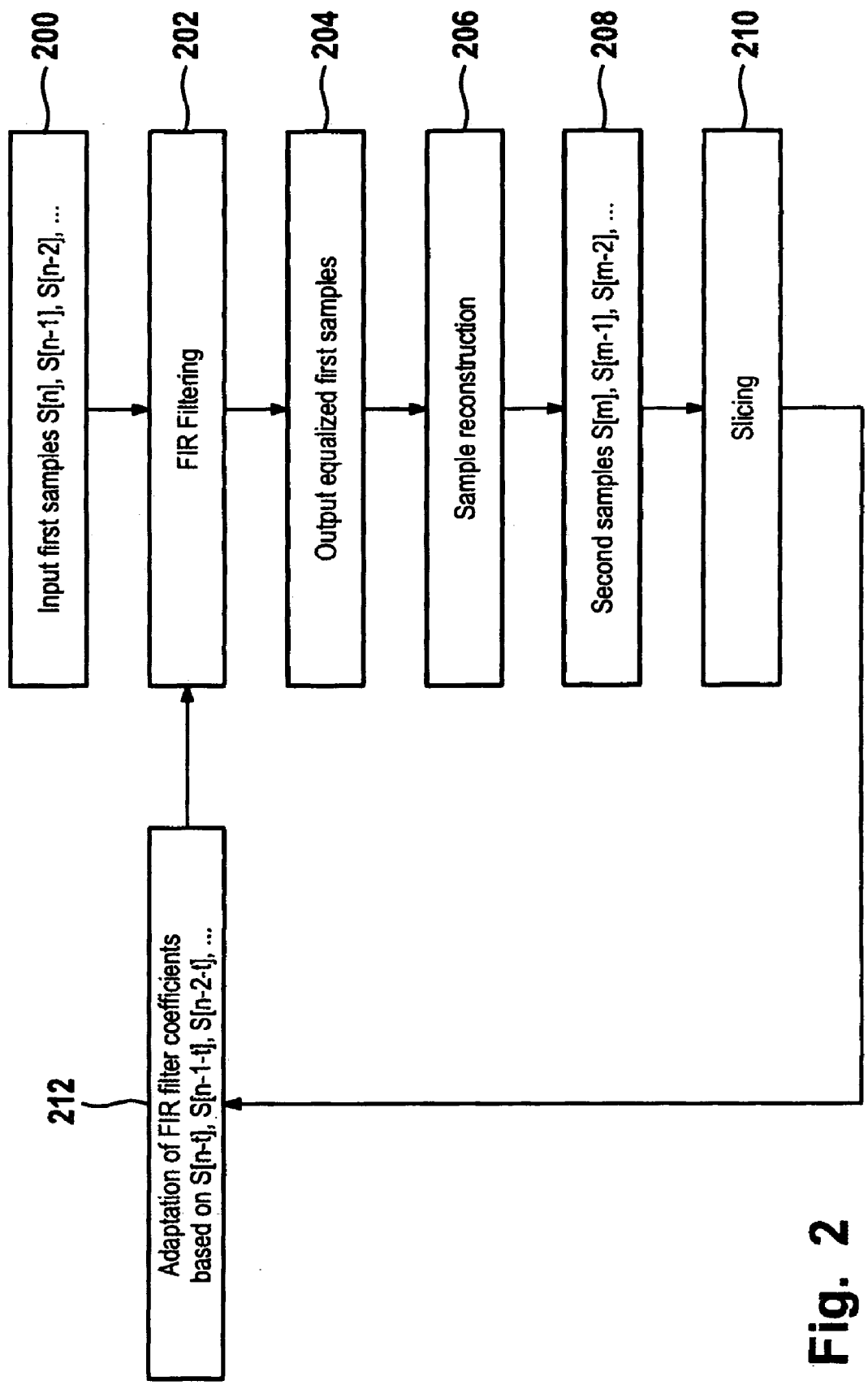
FIG. 2 is a flow diagram illustrating an embodiment of a method for equalising signal samples.

One embodiment of the method for adaptation of the filter coefficients performed by adaptation circuitry 120 is explained by way of example in further detail by making reference to FIG. 2.

In step 200, first samples $S[n]$, $S[n-1]$, $S[n-2]$, ..., i.e. asynchronous samples 110 of the asynchronously over-sampled signal provided by converter 106 (cf. FIG. 1) are inputted into the FIR filter. The FIR filter has a set of filter coefficients which are used to perform the FIR filtering in step 202. After a certain delay the first equalised sample $S[n]$ is outputted in step 204. The delay corresponds to the number of filter coefficients which are also referred to as filter taps. In FIG. 1, the equalised first samples are denoted as samples 118.

The first samples are used for sample reconstruction in step 206, which provides second samples $S[m]$, $S[m-1]$, $S[m-2]$, ... in the synchronous domain (step 208). In step 210, the slicing operation is performed which provides an error signal for each one of the second samples. The error signal is used in step 212 for adaptation of the FIR filter coefficients. It is to be noted that there is a delay of t between the input of a first sample $S[n]$ in step 200, and the input of the corresponding error signal into the filter adaptation performed in step 212. As a consequence, past filter values $S[n-t]$, $S[n-1-t]$, $S[n-2-t]$, ... are used to perform the FIR filter coefficient adaptation on the basis of the error signal.

For example, the adaptation of a filter coefficient $C_i$, where $0 \leq i < k$, of the k FIR filter coefficients is performed as follows:

1. The current value of $C_i[n]$ is given by $C_i[n] = \text{Round}(C_{i_{update}}[n]/A)$, where $C_{i_{update}}[n]$ is the value currently stored in a high-resolution accumulator of the filter coefficient adaptation circuitry used for updating the filter coefficient $C_i$,
   A is a coefficient that sets the effect of the averaging performed by means of the rounding operation 'Round'.

2. The adapted value for $C_i[n+1]$ is calculated by means of $C_{i_{update}}[n+1] = C_{i_{update}}[n] - \{G*S[n-t-i]*E[m]\}$ where
   G is the adaptation gain,
   E [m] is the error signal as generated from the contribution made by $S[n-t-i]$ to the FIR output through the FIR tap under consideration.

The value of t represents the fact that the error E is generated from a baud synchronous sample which may not be temporally coincident with the corresponding input sample $S[n-t-1]$. The value of t is the delay from the input of a first sample $S[n]$ into the FIR filter and the output of the error signal for the resultant synchronous sample $S[m]$ or latency from FIR input to availability of corresponding error signal from the slicer.

This approach for updating the filter coefficients $C_i$ by means of the above equation has the disadvantage that multiplication of S and E is required for each updating of each one of the filter coefficients $C_i$.

Figure 3:
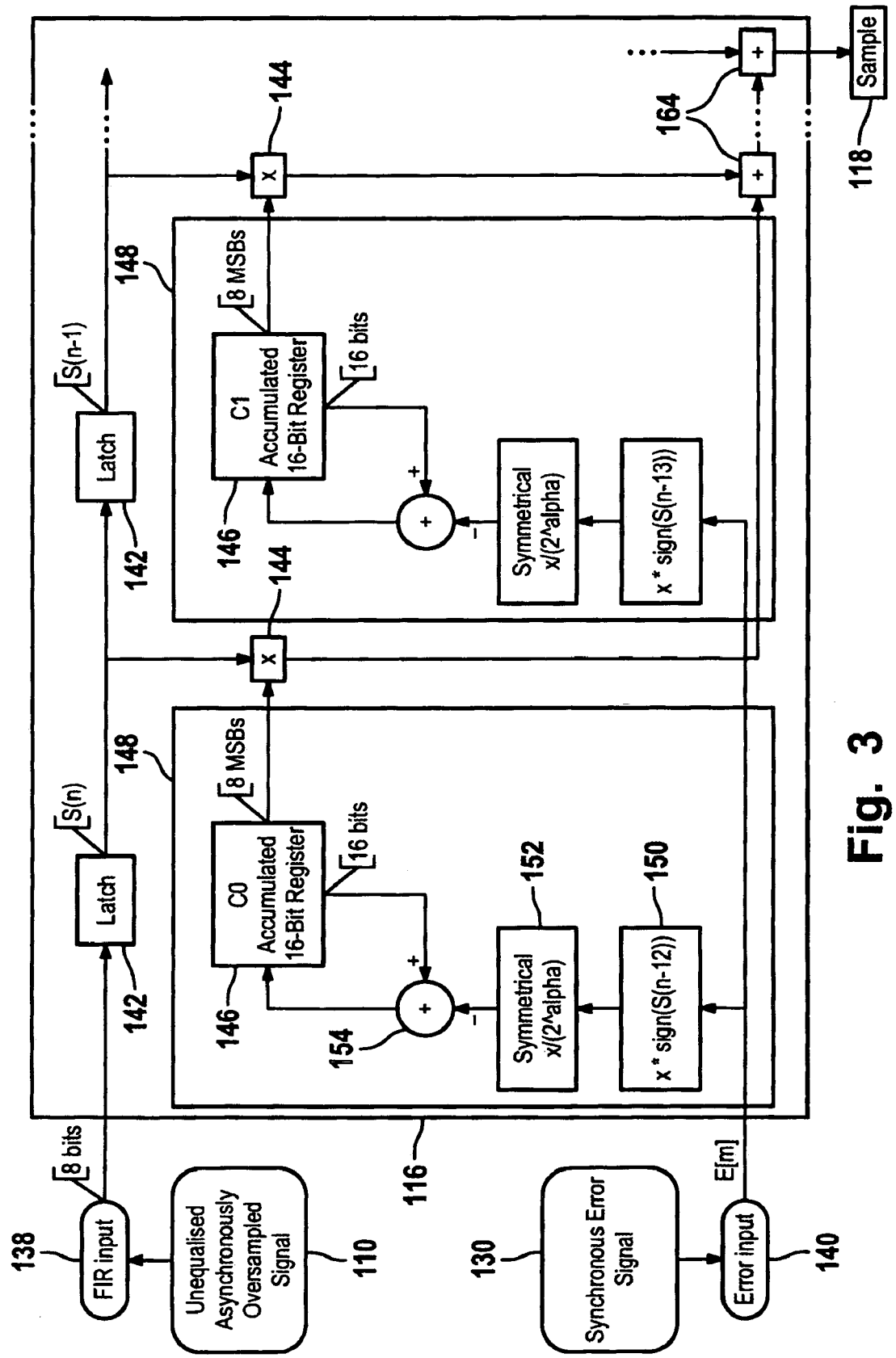
FIG. 3 is a detailed block diagram of an embodiment of a FIR filter.

FIG. 3 shows a block diagram illustrating an alternative to this approach, which avoids a need for this multiplication by taking only the sign of the samples S into consideration. Elements of FIG. 3 that correspond to elements of FIG. 1 are designated by the same reference numerals.

FIR filter 116 has input 138 for inputting of the samples 110 of the unequalised asynchronously over-sampled signal delivered by converter 106 (cf. FIG. 1). In addition FIR filter 116 has input 140 for inputting of error signal 130.

For each filter tap, FIR filter 116 has a latch 142 for storage of one of the samples 110, i.e. samples S[n], S[n−1], S[n−2], . . . and a corresponding multiplier 144 for multiplication of the respective data sample by the filter coefficient Ci of the considered tap i stored in a register 146. The results of the multiplications performed by the multipliers 144 are added up by adders 164, which provide the equalised samples 118.

The filter coefficient adaptation is performed by adaptation module 148. In one embodiment considered here each adaptation module 148 has a module 150 for determining the value of the sign function of the respective data sample S[n−t−i] and for multiplication of E [m] by the value of the sign function.

Module 152 of adaptation module 148 serves for scaling of the output value of module 152, for example by dividing the output value by $2^\alpha$ where $\alpha$ is a coefficient that is conveniently chosen, for example between 1 and 4. In one embodiment, module 152 is implemented by means of a barrel shifter.

The output of module 152 is subtracted from the current value $Ci_{update}[n]$ stored in register 146 by means of subtracter 154. The resultant value for $Ci_{update}[n+1]$ is stored in the register 146. In the example considered here, register 146 has a width of 16 bits whereby only the 8 most significant bits are outputted to multiplier 144. This has the effect of low pass filtering the changing value of Ci and thus reduction of the adaptation noise.

The low pass filtering action is also beneficial in maintaining, on average, a temporal correlation between the samples S[n] and error E[m]. The quality of the adaptation convergence relies upon this correlation being, on average, correct and significantly greater than the noise in the system. Since the samples S[n] are asynchronously oversampled relative to the signal E[m], an average correlation relationship is used, where the greater majority of the adaptation corrections calculated for each tap are sufficiently correct to overcome the minority that are not and still drive the convergence of the adaptation correctly.

In the example considered here, the value of t is 12. The filter coefficients Ci can be updated for each new sample 110 that is entered at input 138 or alternatively for each new error signal E that becomes available at error input 140.

Figure 4:
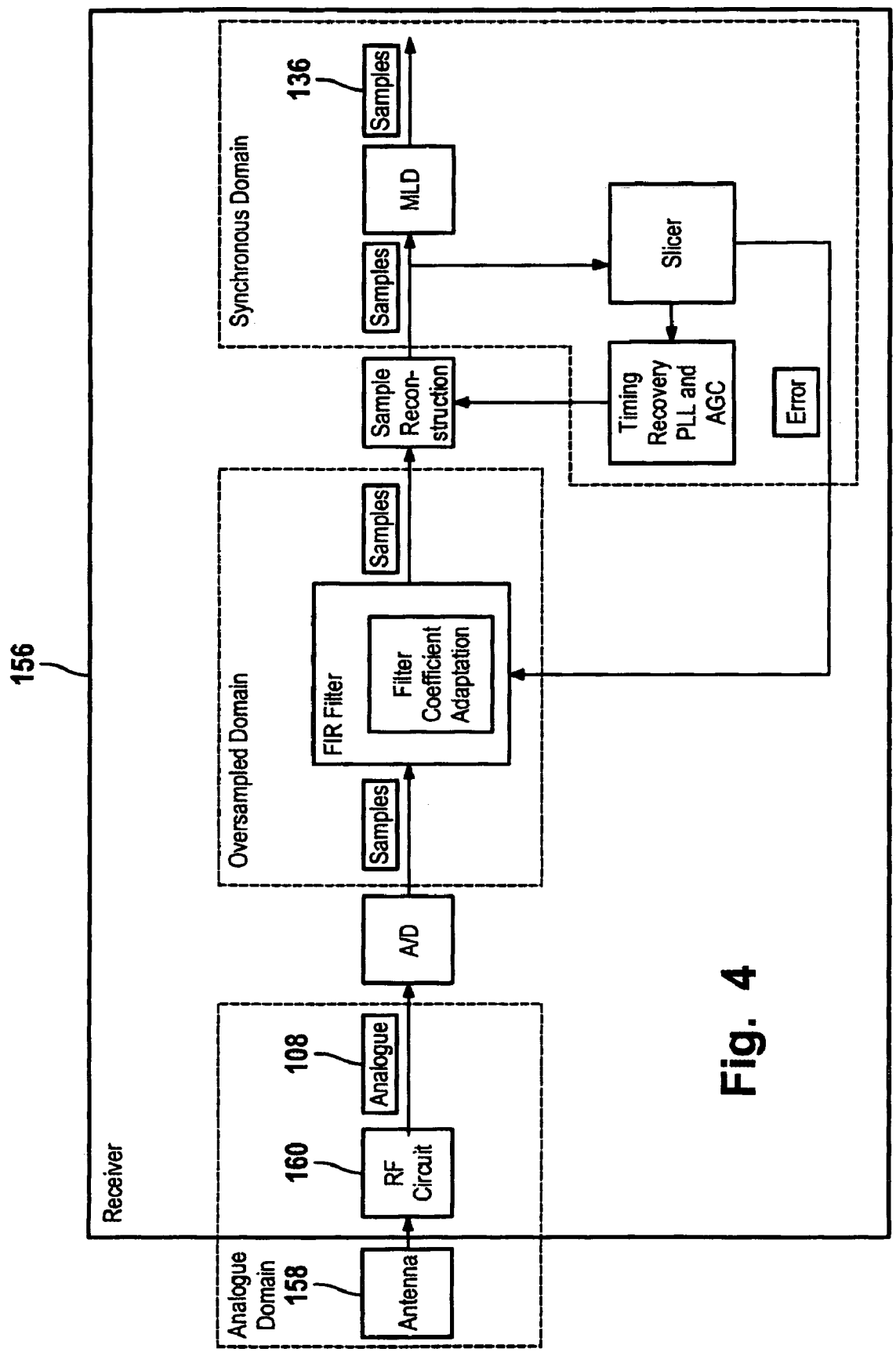
FIG. 4 is a block diagram of an embodiment of a receiver.

FIG. 4 shows a block diagram of a receiver 156. Elements of receiver 156 that correspond to elements of reader apparatus 100 of FIG. 1 are designated by the same reference numerals. Receiver 156 is coupled to an antenna 158. Antenna 158 is coupled to RF circuit 160 of receiver 156.

RF circuit 160 delivers analogue reception signal 108 that is processed in a similar manner as explained above with respect to FIGS. 1 to 3 in order to obtain data samples 136. Alternatively, receiver 156 can also be implemented as a cable receiver. In this instance, an RF cable is coupled to RF circuit 160 for reception of analogue signal 108.

Figure 5:
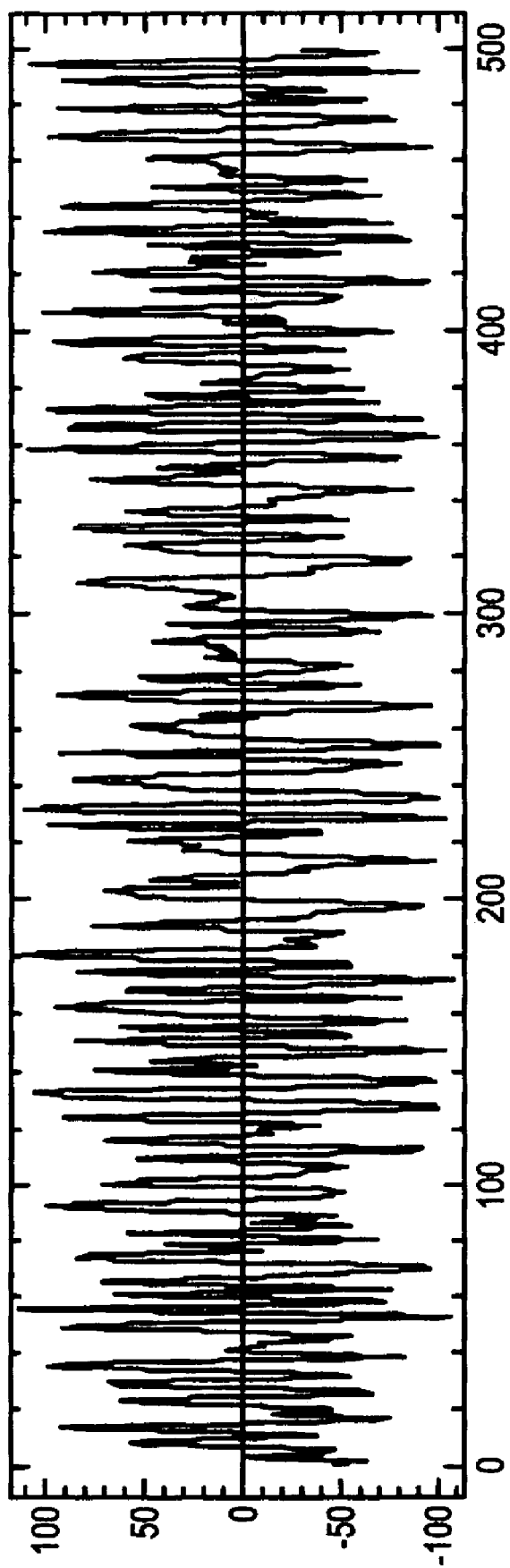
FIG. 5 is a signal diagram of an un-equalised asynchronously over-sampled signal.

FIG. 5 shows an example for an un-equalised asynchronously over-sampled signal, as given by samples 110 of FIG. 1. In the example considered here, the signal has three expected target signal levels, i.e. −64, 0 or +64.

Figure 6:
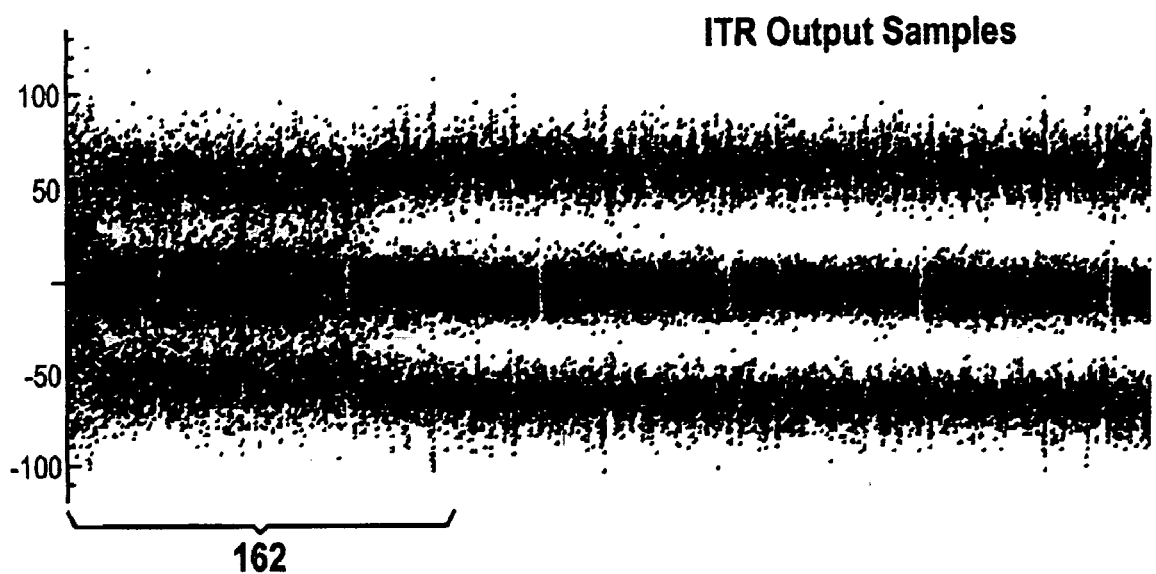
FIG. 6 is a signal diagram illustrating the equalisation of the corresponding synchronous samples during adaptation of the FIR filter coefficients.
Figure 7:
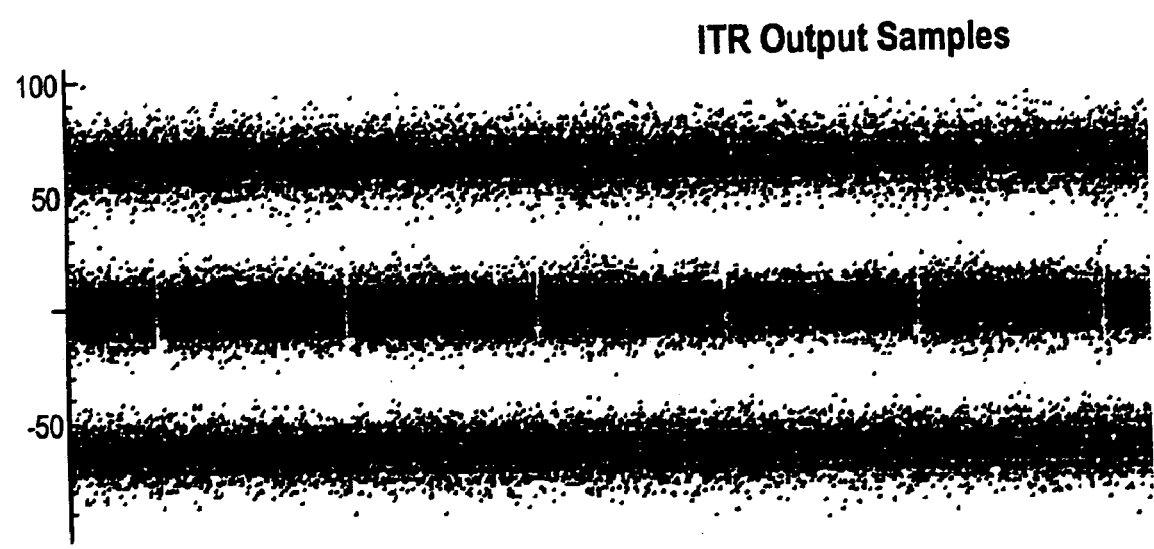
FIG. 7 shows the equalised, synchronous samples after completion of the coefficient adaptation.

FIG. 6 shows the signal of FIG. 5 after equalisation and sample reconstruction during adaptation of the FIR filter coefficients. As apparent from the signal diagram shown in FIG. 6, the quality of the equalisation performed by the FIR filter substantially increases after start period 162 of the filter adaptation process. After the filter adaptation has settled, the adaptation mode can be left. The signal diagram of FIG. 7 shows the equalised samples 124, after the adaptation mode has been left using the filter coefficients that have been obtained as a result of the adaptation process illustrated in FIG. 6.

It should be emphasized that the above-described embodiments of the present disclosure are merely possible examples of implementations, merely set forth for a clear understanding of the principles of the disclosure. Many variations and modifications may be made to the above-described embodiments without departing substantially from the spirit and principles of the present disclosure. All such modifications and variations are intended to be included herein within the scope of this disclosure.

Therefore, having thus described the invention, at least the following is claimed:

1. An equaliser circuit for equalising first samples of an asynchronously over-sampled signal, the equalising circuit comprising:
   a first input for inputting the first samples into an FIR filter, the FIR filter having a set of filter coefficients;
   an output for outputting the equalised first samples;
   a second input for inputting an error signal, the error signal being indicative of a deviation of a second sample of an equalised synchronous signal from one of a set of predefined signal levels, the error signal having a delay with respect to a current first sample at the first input, the sequence of the first samples used for the adaptation having substantially the same delay, the equalised synchronous signal being reconstructed from the equalised first samples;
   a circuit component for adaptation of the filter coefficients based on the error signal and a sequence of the first samples, and operable for adaptation of at least one of the filter coefficients by determining the sign of the error signal in accordance with the sign of one of the first samples of the sequence and updating the one of the filter coefficients on the basis of the absolute value of the error signal and its sign.

2. The equaliser circuit of claim 1, further comprising a memory component for storing past first samples within a time window covering at least the delay.

3. The equaliser circuit of claim 1, the circuit component being operable for adaptation of at least one of the filter coefficients by multiplying the error signal by one of the first samples of the sequence and updating the one of the filter coefficients based on a result of the multiplication.

4. The equaliser circuit of claim 3, the circuit component being operable to multiply the result of the multiplication by an adaptation gain factor.

5. The equaliser circuit of claim 1, further comprising a barrel shifter for scaling the error signal.

6. The equaliser circuit of claim 1, the circuit component comprising a low pass filter for filtering an adaptation value used for updating one of the filter coefficients.

7. The equaliser circuit of claim 1, the circuit component further comprising an accumulator and a multiplier for each filter coefficient, the accumulator having a first bit width and the multiplier having a second bit width, a set of most significant bit positions of the accumulator serving as an input for the multiplier.

8. An electronic system for recovering a synchronous digital data signal from an asynchronously over-sampled signal, the electronic system
comprising:
an equaliser circuit for equalising first samples of the asynchronously over-sampled signal having:
a first input for inputting the first samples into an FIR filter,
the FIR filter having a set of filter coefficients;
an output for outputting the equalised first samples;
a second input for inputting an error signal, the error signal being indicative of a deviation of a second sample of an equalised synchronous signal from one of a set of predefined signal levels, the error signal having a delay with respect to a current first sample at the first input, the sequence of the first samples used for the adaptation having substantially the same delay, the equalised synchronous signal being reconstructed from the equalised first samples; and
a circuit component for adaptation of the filter coefficients based on the error signal and a sequence of the first samples, and operable for adaptation of at least one of the filter coefficients by determining the sign of the error signal in accordance with the sign of one of the first samples of the sequence and updating the one of the filter coefficients on the basis of the absolute value of the error signal and its sign;
a sample reconstruction circuit for providing the equalised synchronous signal on the basis of the equalised first samples; and
a slicer circuit for providing the error signal, the slicer circuit having a number of levels corresponding to the set of pre-defined signal levels.

9. The electronic system of claim 8, further comprising a timing recovery and automatic gain control circuit coupled between the slicer circuit and the sample reconstruction circuit, and a maximum likelihood detection circuit for providing the synchronous digital data signal from the equalised synchronous signal.

10. An electronic device comprising:
means for FIR filtering of first samples;
means for adapting filter coefficients used for the FIR filtering on the basis of an error signal and a sequence of the first samples, the sequence of the first samples and the error signal having substantially the same delay, wherein the means for adapting filter coefficients operates outside a synchronous domain, the synchronous domain producing an equalised synchronous signal representation of the first samples, and operates by determining a sign of the error signal in accordance with a sign of one of the first samples of the sequence and updating at least one of the filter coefficients on the basis of the absolute value of the error signal and its sign.

11. A tape drive apparatus comprising:
a head for reading a signal from a loaded tape media;
sampling means for over-sampling the signal to provide first samples;
an FIR filter for filtering the first samples, the FIR filter having a set of filter coefficients, an output for outputting the equalised first samples, a second input for inputting an error signal, the error signal being indicative of a deviation of a second sample of an equalised synchronous signal from one of a set of predefined signal levels, the error signal having a delay with respect to a current first sample at the first input, the sequence of the first samples used for the adaptation having substantially the same delay, the equalised synchronous signal being reconstructed from the equalised first samples; and
a circuit component for adaptation of the filter coefficients based on the error signal and a sequence of the first samples, and operable for adaptation of at least one of the filter coefficients by determining the sign of the error signal in accordance with the sign of one of the first samples of the sequence and updating the one of the filter coefficients on the basis of the absolute value of the error signal and its sign.

12. A disc drive apparatus comprising:
a read head for reading an analogue signal from a disc;
sampling means for over-sampling the analogue signal to provide first samples;
an FIR filter for filtering the first samples, the FIR filter having a set of filter coefficients, an output for outputting the equalised first samples, a second input for inputting an error signal, the error signal being indicative of a deviation of a second sample of an equalised synchronous signal from one of a set of predefined signal levels, the error signal having a delay with respect to a current first sample at the first input, the sequence of the first samples used for the adaptation having substantially the same delay, the equalised synchronous signal being reconstructed from the equalised first samples; and
a circuit component for adaptation of the filter coefficients based on the error signal and a sequence of the first samples, and operable for adaptation of at least one of the filter coefficients by determining the sign of the error signal in accordance with the sign of one of the first samples of the sequence and updating the one of the filter coefficients on the basis of the absolute value of the error signal and its sign.

13. The disc drive apparatus of claim 12, the read head being adapted to read a magnetic disc.

14. The disc drive apparatus of claim 12, the read head being adapted to read an optical disc.

15. A receiver comprising:
an interface for receiving an analogue signal;
sampling means for over-sampling the analogue signal to provide first samples;
an FIR filter for filtering the first samples, the FIR filter having a set of filter coefficients, an output for outputting the equalised first samples, a second input for inputting an error signal, the error signal being indicative of a deviation of a second sample of an equalised synchronous signal from one of a set of predefined signal levels, the error signal having a delay with respect to a current first sample at the first input, the sequence of the first samples used for the adaptation having substantially the same delay, the equalised synchronous signal being reconstructed from the equalised first samples; and
a circuit component for adaptation of the filter coefficients based on the error signal and a sequence of the first samples, and operable for adaptation of at least one of the filter coefficients by determining the sign of the error signal in accordance with the sign of one of the first samples of the sequence and updating the one of the filter coefficients on the basis of the absolute value of the error signal and its sign.

16. The receiver of claim 15, the interface being a wireless interface.

17. A method for equalising first samples of an asynchronously over-sampled signal, the method comprising:
inputting the first samples into an FIR filter, the FIR filter having a set of filter coefficients;
outputting the equalised first samples;

inputting an error signal, the error signal being indicative of a deviation of a second sample of an equalised synchronous signal from one of a set of predefined signal levels, the error signal having a delay with respect to a current first sample, the sequence of the first samples used for the adaptation having substantially the same delay, the equalised synchronous signal being reconstructed from the equalised first samples;

adapting the filter coefficients based on the error signal and a sequence of the first samples; and determining a sign of the error signal in accordance with a sign of one of the first samples of the sequence.

18. The method of claim 17, whereby the over-sampling rate for obtaining the first samples is between 1.2 and 5, and 1.5 times the baud rate of the synchronous signal.

19. The method of claim 17, further comprising multiplying the error signal by one of the first samples of the sequence and updating the one of the filter coefficients based on a result of the multiplication.

20. The method of claim 17, further comprising low pass filtering of an adaptation value used for adaptation of one of the filter coefficients.

21. The equaliser circuit of claim 1, wherein the circuit component operates outside a synchronous domain, wherein the equalised synchronous signal is constructed in the synchronous domain.

22. The electronic system of claim 8, wherein the circuit component operates outside a synchronous domain, wherein the equalised synchronous signal is constructed in the synchronous domain.

23. The method of claim 17, wherein the equalized synchronous signal is constructed in a synchronous domain and adaptation of the filter coefficients occurs in an asynchronous domain.

* * * * *